(12) United States Patent
Lee et al.

(10) Patent No.: US 10,199,100 B1
(45) Date of Patent: Feb. 5, 2019

(54) SENSING CIRCUIT AND MEMORY USING THEREOF

(71) Applicant: INSTON INC., Los Angeles, CA (US)

(72) Inventors: Albert Lee, Los Angeles, CA (US);
Hochul Lee, Los Angeles, CA (US);
Kang-Lung Wang, Los Angeles, CA (US)

(73) Assignee: INSTON INC., Los Angeles, CA (US)

( * ) Notice: Subject to any disclaimer, the term of this patent is extended or adjusted under 35 U.S.C. 154(b) by 0 days.

(21) Appl. No.: 15/718,312

(22) Filed: Sep. 28, 2017

(51) Int. Cl.
*G11C 7/14* (2006.01)
*G11C 13/00* (2006.01)

(52) U.S. Cl.
CPC .............. *G11C 13/004* (2013.01); *G11C 7/14* (2013.01); *G11C 13/0023* (2013.01); *G11C 13/0069* (2013.01)

(58) Field of Classification Search
CPC ........................................................ G11C 7/14
USPC ............................................. 365/210.1, 207
See application file for complete search history.

(56) References Cited

U.S. PATENT DOCUMENTS

| 6,845,052 B1 | 1/2005 | Ho et al. |
| 7,286,429 B1 | 10/2007 | Liaw et al. |
| 7,933,147 B2 | 4/2011 | Lin et al. |
| 2014/0029366 A1* | 1/2014 | Trivedi ................. G11C 11/419 365/210.1 |

* cited by examiner

*Primary Examiner* — Jason Lappas
(74) *Attorney, Agent, or Firm* — Li & Cai Intellectual Property (USA) Office

(57) ABSTRACT

A sensing circuit includes a first sensing terminal, a second sensing terminal, a second grounding terminal, and a second grounding terminal. The first sensing terminal is connected to a source electrode of a transistor of a memory macro through a bit line. The second sensing terminal is electrically connected to a drain electrode of the transistor of the memory marco through a resistive memory device to a source line, and is not continuously connected to the grounding voltage. The first grounding terminal is used as a reference voltage of a voltage of the first sensing terminal. The second grounding terminal is used as a reference voltage of a voltage of the second sensing terminal. The sensing circuit outputs a sensing signal according to a voltage difference between the first sensing terminal and the second sensing terminal.

6 Claims, 9 Drawing Sheets

$$V_{BL\_CONV}(t) = V_{READ} e^{\frac{-t}{R_{CELL}*C_{BL}}} \quad (1)$$

$$2V_{M\_CONV}(t) = V_{READ}(e^{\frac{-t}{R_H*C_{BL}}} - e^{\frac{-t}{R_L*C_{BL}}}) \quad (2)$$

FIG. 5A $$V_{BL\_DDL}(t) = V_{READ}(\frac{C_X}{C_{SL}} + \frac{C_X}{C_{BL}}(e^{\frac{-t}{R_{CELL}*C_X}})) \quad (3)$$

$$V_{SL\_DDL}(t) = V_{READ} * \frac{C_X}{C_{SL}} * (1 - (e^{\frac{-t}{R_{CELL}*C_X}})) \quad (4)$$

$$2V_{M\_DDL}(t) = V_{READ}(e^{\frac{-2t}{e^{R_H C_{BL}}}} - e^{\frac{-2t}{e^{R_L C_{BL}}}}) \quad (5)$$

$$E_{READ} = C_{BL} * V_{READ}(V_{READ} - V_{BL}) \quad (6)$$

$$C_X = \frac{C_{BL} * C_{SL}}{C_{BL} + C_{SL}} \quad (7)$$

FIG. 5B

SENSING CIRCUIT AND MEMORY USING THEREOF

BACKGROUND OF THE INVENTION

1. Field of the Invention

The present disclosure relates to a sensing circuit for a memory; in particular, to a sensing circuit for a memory that have high speed and low energy.

2. Description of Related Art

Recently, a variety of new memory devices have been proposed to replace the commercially available flash, providing orders of improvement in programming time and energy. The majority of these emerging memory devices are similar to electrically-programmable resistors, in which the device resistance changes based on the voltage and current applied. For example, the magnetoresistive random access memory (MRAM) stores data by changing the orientation of the magnetic moment in a magnetic tunnel junction (MTJ), which includes two magnetic layers separated by a tunneling barrier. If the two layers have the same magnetic orientation, the MRAM shows a low resistive state (LRS); if they have opposite orientations, the device has a high resistive state (HRS).

Similarly, the other resistive memory devices also have the different resistive states of one memory cell, i.e. the low-resistive state (LRS) and the high-resistive state (HRS), to be observed.

Referring to FIG. 1, FIG. 1 shows a schematic diagram of a transistor and a resistive memory device used in a memory macro. In general, one memory cell includes at least one transistor T and a resister R as shown in FIG. 1, in which the structure of one transistor and one resistive memory device is also called 1T-1R cell.

In FIG. 1, a drain electrode of the transistor T is connected to a bit line BL through the resistive memory device R. The gate electrode of the transistor T is connected to a word line WL, and the source electrode of the transistor T is connected to a source line SL. The transistor T is selected by asserting WL, which turns on the transistor T to connect the memory device to the source line SL and bit line BL.

Conventionally, the source line SL is connected to a grounding voltage. The sensing circuit for the memory cell can just detect the voltage of the bit line BL for determining the state of the memory device.

As technology scales, increase of variation and device resistance leads to not only further worsening of the read time, but also a greater amount of read energy as the data lines needs more time to develop. Therefore, it is necessary to provide a sensing method that can achieve high speed and energetically efficient sensing.

In the embodiment, a sensing method for the memory cell in FIG. 1 is used by reusing read current from the bit line (BL) to create a differential voltage swing on the source line SL. The voltage of the bit line BL and voltage of the source line SL are combined for a larger sensing signal. To obtain the same amount of margin, a smaller bit line BL voltage swing is required, allowing a reduced read time as well as energy.

SUMMARY OF THE INVENTION

A sensing circuit is provided in the present disclosure. The sensing circuit is electrically connected to a memory cell. The memory cell includes a transistor and a resistive memory device. The sensing circuit includes a first sensing terminal, electrically connected to a drain electrode of the transistor through the resistive memory device to a bit line, wherein the first sensing terminal is not continuously connected to a precharge voltage; a second sensing terminal, electrically connected to a source electrode of the transistor through a source line, wherein the second sensing terminal is not continuously connected to the grounding voltage. A first grounding terminal, connected to a reference bit line and used as a reference voltage of a voltage of the first sensing terminal; and a second grounding terminal, connected to a reference source line and used as a reference voltage of a voltage of the second sensing terminal; wherein the sensing circuit outputs a sensing signal according to a voltage difference between the first sensing terminal and the second sensing terminal, and the reference voltage of the first grounding terminal and the reference voltage of the second grounding terminal. When the sensing circuit is in an initial state, the first sensing terminal and the first grounding terminal are connected to a precharge voltage, and the second sensing terminal and the second grounding terminal are connected to the grounding voltage. During signal development, the first sensing terminal, the second sensing terminal, the first grounding terminal, and the second grounding terminal are floating.

A memory macro is provided in the present disclosure, which includes a main control module, an I/O driver, a memory cell array including a plurality of memory cells, each memory cell comprising a transistor and a resistive memory device, an X-decoder, electrically connected to the main control module for receiving at least one X-direction control signal, a Y-multiplexer electrically connected to the main control module for receiving at least one Y-direction control signal, and a Read/Write circuity comprising a plurality of sensing circuits, wherein the Read/Write circuity is electrically connected to the I/O driver, and electrically connected to the memory cell array through the Y-multiplexer; wherein the sensing circuit is electrically connected to a memory cell, the sensing circuit comprising: a first sensing terminal electrically connected to a drain electrode of the transistor through a bit line and the resistor, and not continuously connected to a precharge voltage; a second sensing terminal, electrically connected to a source electrode of the transistor through a source line, and not continuously connected to a precharge voltage; a first grounding terminal, connected to a reference bit line and used as a reference of a voltage of the first sensing terminal; and a second grounding terminal, connected to a reference source line and used as a reference of a voltage of the second sensing terminal; wherein the sensing circuit outputs a sensing signal according to a voltage difference between the first sensing terminal and the first grounding terminal, compared to the voltage difference between the second sensing terminal and the second grounding terminal. When the sensing circuit is in an initial state, the first sensing terminal and the first grounding terminal are connected to a precharge voltage, and the second sensing terminal and the second sensing terminal and second grounding terminal are connected to the grounding voltage. During signal development, the first sensing terminal, the second sensing terminal, the first grounding terminal, and the second grounding terminal are floating.

According to the above, the sensing circuit of the present disclosure employs two floating input terminals and two reference terminals (total of four voltage terminals) to detect the high-resistive state resistance and the low-resistive state resistance of the memory cell for enhancing the reading speed and reducing the power consumption. Furthermore, the sensing circuit of the present disclosure also decreases the voltage stress during read for reducing the disturbance. We refer to the above embodiment as the dual-data line (DDL) scheme.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which:

FIGS. 5A-5B are equation lists for the read waveforms in FIG. 4 of the present disclosure.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Figure 1:
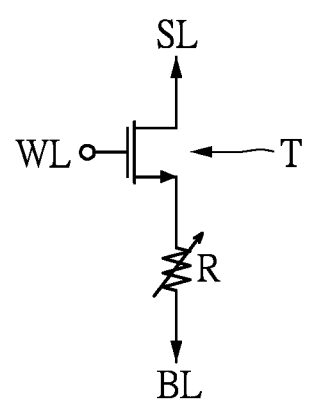
FIG. 1 shows a schematic diagram of one memory cell including a transistor and a resistive memory device used in a memory device.
Figure 2:
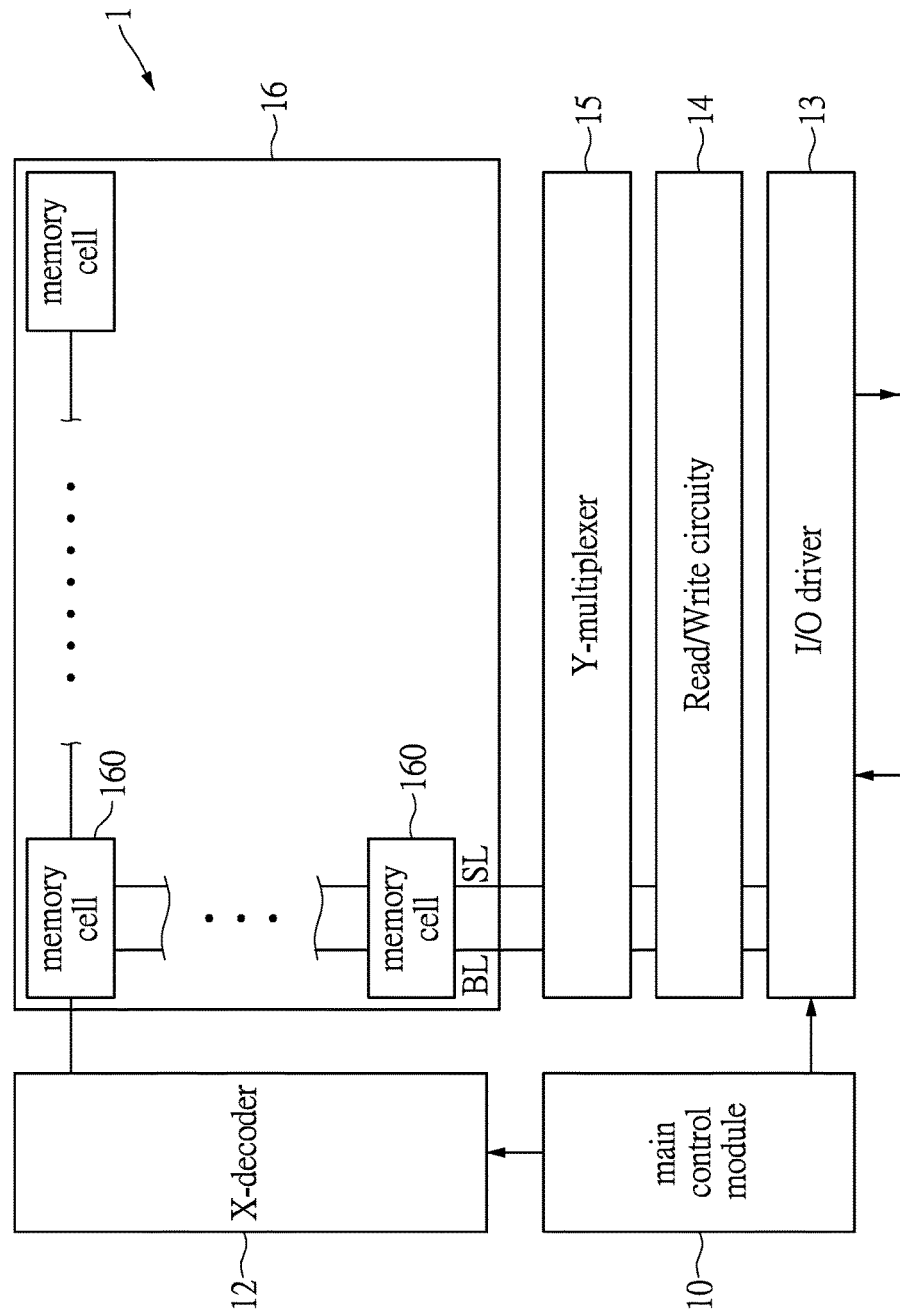
FIG. 2 shows a schematic diagram of a memory device of one embodiment of the present disclosure.
Figure 3:
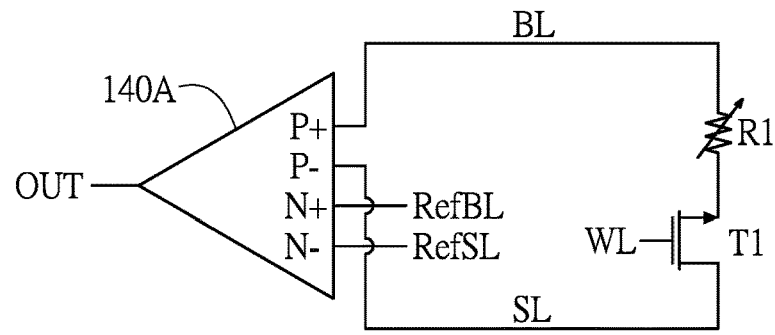
FIG. 3 shows a schematic diagram of a sensing circuit of one embodiment of the present disclosure.

Referring to FIG. 2 and FIG. 3, FIG. 2 shows a schematic diagram of a memory macro of one embodiment of the present disclosure and FIG. 3 shows a schematic diagram of a sensing circuit of one embodiment of the present disclosure.

Referring to FIG. 2, a memory device 1 includes a main control module 10, an X-decoder 12, an I/O driver 13, a Read/Write circuitry 14, a Y-multiplexer 15, and a memory cell array 16. In the embodiment, the memory cell array 16 includes a plurality of memory cells 160. In the embodiment, the Read/Write circuity 14 includes a plurality of sensing circuits 140A and a plurality of write drivers (not shown). Each sensing circuit 140A and each write driver (not shown) is electrically connected to at least one memory cell 160 through the Y-multiplexer 15, respectively. The X-decoder 12 is electrically connected to the main control module 10 for receiving at least one X-direction control signal for selecting at least one of the memory cells 160. The Y-multiplexer 15 is electrically connected to the main control module 10 for receiving at least one Y-direction control signal to read or write at least one memory cell 160.

Referring to FIG. 3, the sensing circuit 140A is a sensing amplifier, which includes a first sensing terminal P+, a second sensing terminal P−, a first grounding terminal N+ and a second grounding terminal N−. In the embodiment, the sensing circuit 140A is electrically connected to a memory cell 160. The memory cell 160 includes a transistor T1 and a resistive memory device R1 through a bit line and a source line. The first sensing terminal P+ is electrically connected to a drain electrode of the transistor T1 through the bit line BL and the resistive memory device, and the second sensing terminal P− is electrically connected to a source electrode of the transistor T1 through the source line SL. The gate electrode of the transistor T1 is electrically connected to a word line WL. In the embodiment, the word lines WL are selected by the X-decoder 12.

In the previous embodiment, the source line SL and the reference source line REFSL are connected to the grounding voltage and the sense amplifier does not use them as inputs. In the present embodiment, the first grounding terminal N+ is used as a reference connected to the reference bit line REFBL, i.e., the sensing circuit 140A can detect the voltage between the first sensing terminal P+ and the first grounding terminal N+ for observing the voltage of the bit line $V_{BL} - V_{REFBL}$. The second grounding terminal N− is used as a reference connected to the reference source line REFSL, i.e., the sensing circuit 140A can detect the voltage between the second sensing terminal P− and the second grounding terminal N− for observing the voltage of the source line $V_{SL} - V_{REFSL}$. The amplifier detects the voltage difference between the first sensing terminal P+ and the first grounding terminal N+, compared the second sensing terminal P− and the second grounding terminal N−, i.e., $V_{BL} - V_{SL} - V_{REFBL} + V_{REFSL}$. In other words, the voltages of the first sensing terminal P+ and the second sensing terminal P− are variable rather than grounded.

Figure 4:
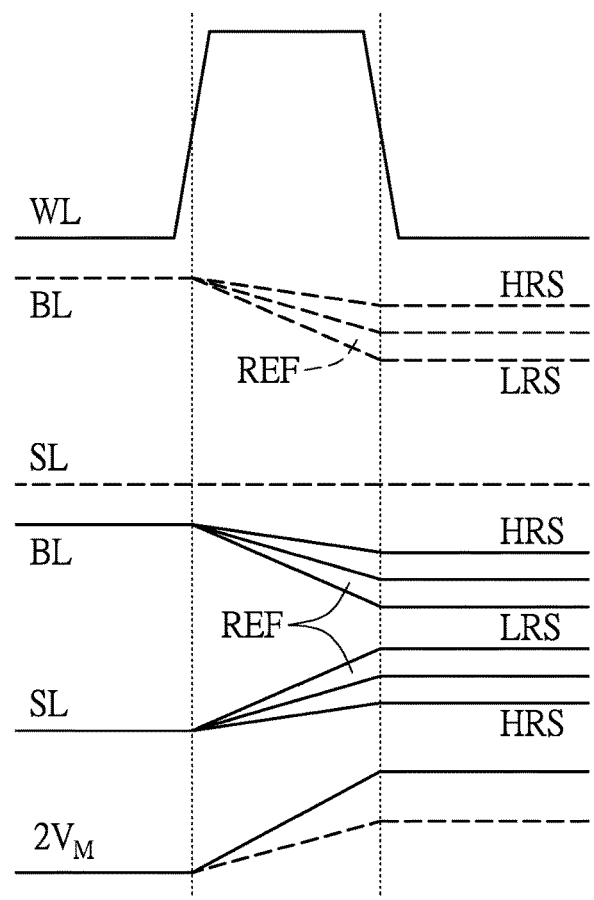
FIG. 4 is an illustration of the waveform during read operation of the conventional and the embodiment of the present disclosure.

Referring to FIG. 4, the upper part of the FIG. 4 is a waveform of word line WL applied to the gate electrode of the transistor T1. In the embodiment, the waveform of the word line WL is a trapezoidal wave. The middle part of the FIG. 4 is waveforms of the bit line BL and the source line SL for the conventional and the present disclosure. The dashed lines is a conventional waveform applied to the source line SL and bit line BL, i.e., the conventional source line SL of the memory cell is connected to a grounding voltage. The solid lines of the middle part of FIG. 4 are voltage waveforms applied to the source line of the embodiment of the present disclosure, i.e., the present disclosure allows SL to develop as well as BL. The lower part of FIG. 4 shows the sensing margin, which is a voltage difference between the bit line BL and the reference bit line REFBL, compared to the source line SL and the reference source line REFSL in the present disclosure, showing a ~2× improvement over the conventional.

Instead of continuously grounding the source line SL during the read operation, the sensing circuit 140A initially connects the SL to a ground voltage, then leaves it floating once the bit line BL starts to develop. As voltage the word line WL is asserted, the read current discharging the bit line $V_{BL}$ charges the source line SL (in contrast to flowing to ground as in the conventional case, i.e. the source line is connected to the grounding voltage), resulting in a similar, but opposite voltage swing on the SL as compared to the voltage swing on the bit line BL. Instead of applying $V_{BL}$ to the sense amplifier, the voltage between the bit line $V_{BL}$ and the voltage of the source line $V_{SL}$ is applied to the sense amplifier. In other words, in the initial state, the first sensing terminal P+ is connected to a precharge voltage and the second sensing terminal P− is connected to the grounding voltage. During signal development, the, the first sensing terminal P+ and the second sensing terminal P− are floating. The sensing circuit 140A outputs the sensing signal based on the voltage difference between the first sensing terminal P+ and the second sensing terminal P− of the sensing circuit, the reference voltage of the first grounding terminal N+, and the reference voltage of the second grounding terminal N−.

If the memory cell is in a low resistive state, a larger cell current leads to a fast discharge of the bit line BL and a fast charging of the source line SL. On the other hand, a high resistive memory cell creates a small cell current, thus the bit line BL and source line SL remains closer to $V_{READ}$ and the grounding voltage, respectively. The waveforms during read operation of the sensing circuit 140A are shown in FIG. 4. By reusing the cell read current, we create a differential voltage swing on the source line SL and combine this with the original bit line voltage $V_{BL}$ to achieve an increased total margin. In the embodiment, the source line SL and the bit line BL are both not continuously connected to a fixed voltage, i.e., a grounding voltage or a reference voltage, i.e. both the source line SL and the bit line BL are floating.

For conventional sensing methods, the bit line voltage $V_{BL\_CONV}$ with respect to time follows a RC discharge as in equation (1) shown in FIG. 5A when the source line SL is connected to the grounding voltage. The read margin of conventional circuit $V_{M\_CONV}$, defined as a half of the bit line voltage difference $V_{BL\_CONV}$ between reading a HRS cell and a LRS cell, is given by equation (2) shown in FIG. 5A.

$$V_{BL\_CONV}(t) = V_{READ} e^{\frac{-t}{R_{CELL}*C_{BL}}} \quad (1)$$

$$2V_{M\_CONV}(t) = V_{READ} \left( e^{\frac{-t}{R_H*C_{BL}}} - e^{\frac{-t}{R_L*C_{BL}}} \right) \quad (2)$$

In the embodiment, $V_{READ}$ is a DC voltage level used for precharge. $C_{BL}$ is a capacitance of the bit line. $C_{SL}$ is a capacitance of the source line. $R_{CELL}$ is a resistance of the memory cell, in which $R_H$ is the resistance of the high-resistive state and $R_L$ is the resistance of the low-resistive state. In the embodiment, the equation (1) and the equation (2) are first-order approximations.

The voltage of the bit line $V_{BL}$ and the voltage of source line $V_{SL}$ as a function of time in the present disclosure are as shown in equations (3) and equation (4) of FIG. 5B, respectively:

$$V_{BL\_DDL}(t) = V_{READ} \left( \frac{C_X}{C_{SL}} + \frac{C_X}{C_{BL}} \left( e^{\frac{-t}{R_{CELL}*C_X}} \right) \right) \quad (3)$$

$$V_{SL\_DDL}(t) = V_{READ} * \frac{C_X}{C_{SL}} * \left( 1 - \left( e^{\frac{-t}{R_{CELL}*C_X}} \right) \right) \quad (4)$$

In the embodiment, $V_{BL\_DDL}$ is the voltage of the first sensing terminal P−. $V_{SL\_DDL}$ is the voltage of the second sensing terminal P−. $V_{READ}$ is a DC voltage level used for precharge. $C_{BL}$ is a capacitance of the bit line. $R_{CELL}$ is a resistance of the memory cell, in which $R_H$ is the resistance of the high-resistive state and $R_L$ is the resistance of the low-resistive state. $C_{SL}$ is a capacitance of the source line. In the equation, $C_X=(C_{BL}*C_{SL})/(C_{BL}+C_{SL})$ as shown in equation (7) of FIG. 5B. Assuming that the bit line capacitance $C_{BL}$ is equal to the source line capacitance $C_{SL}$, the margin, defined as a half of the voltage difference of the bit line voltage $V_{BL}$ and the source line voltage $V_{SL}$ is shown in equation (5) of FIG. 5B. In the embodiment, the voltage margin in the present disclosure is symbolled by $V_{M\_DDL}$. In the embodiment, the read voltage $V_{READ}$ is a DC reference voltage, used as the precharge voltage. In other words, an output terminal OUT of the sensing circuit 140A outputs a sensing signal to the I/O driver 13 according to the voltage difference between the first sensing terminal P+ and the first grounding terminal N+, versus the voltage difference between the second sensing terminal P− and the second grounding terminal N−. In the embodiment, the equation (3) and the equation (4) are first-order approximations.

$$2V_{M\_DDL}(t) = V_{READ} \left( e^{\frac{-2t}{R_H C_{BL}}} - e^{\frac{-2t}{R_L C_{BL}}} \right) \quad (5)$$

In the embodiment, $V_{M\_DDL}$ is a half of the voltage margin between the first sensing terminal P+ and the second sensing terminal P−. Comparing equations (2) and (5), it can be found that the sensing circuit 140A in the present disclosure can achieve the same amount of margin as the conventional method within half the developing time of the bit line voltage $V_{BL}$. The energy consumed on the bit line BL can be obtained by equation (6) in FIG. 5B. In the embodiment, the equation (5) is a first-order approximation.

$$E_{READ} C_{BL} * V_{READ} (V_{READ} - V_{BL}) \quad (6)$$

In the embodiment, the energy has a 50% reduction according to the equation 6.

Referring to FIG. 6A, FIG. 6B, FIG. 6C and FIG. 6D, FIGS. 6A-6D shows schematic diagrams of a sensing circuit of one embodiment of the present disclosure.

Figure 6A:
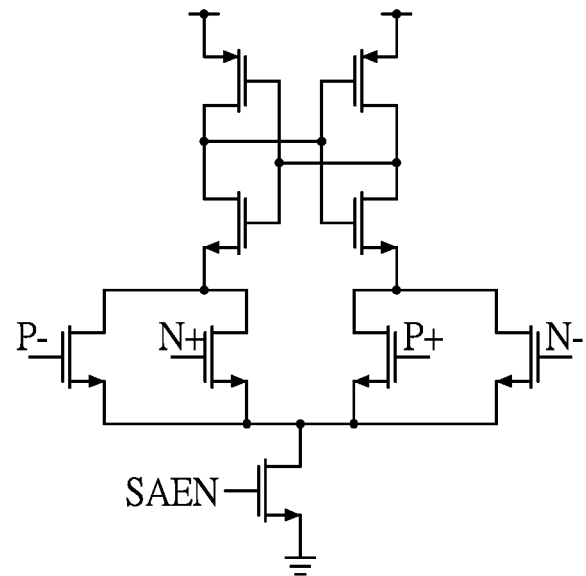
FIGS. 6A-6D shows schematic diagrams of a sensing amplifier of one embodiment of the present disclosure.
Figure 6B:
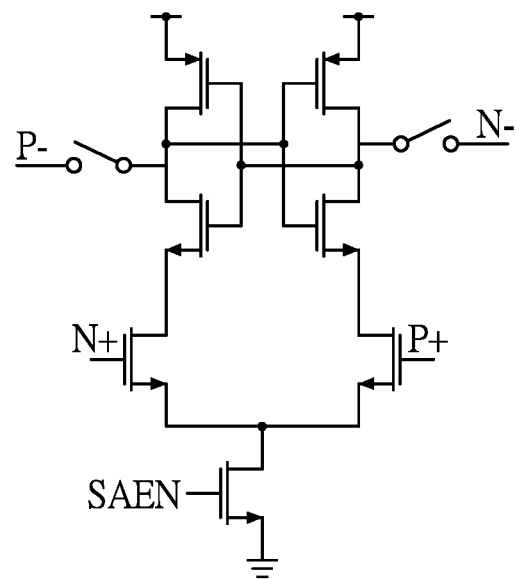
Figure 6C:
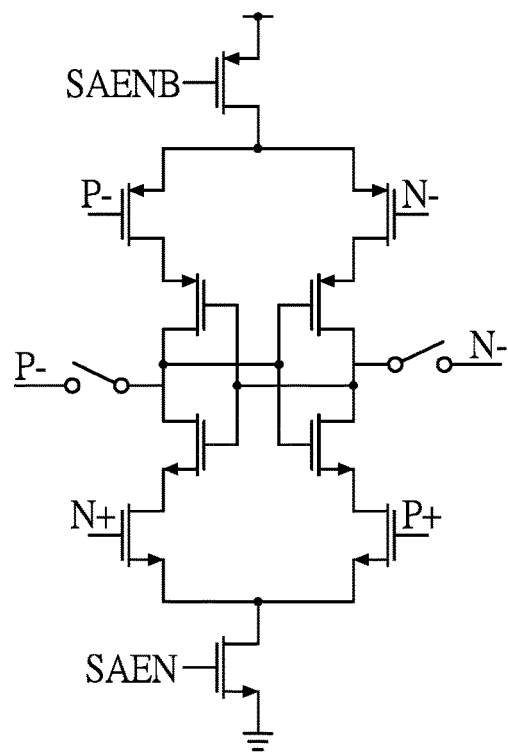
Figure 6D:
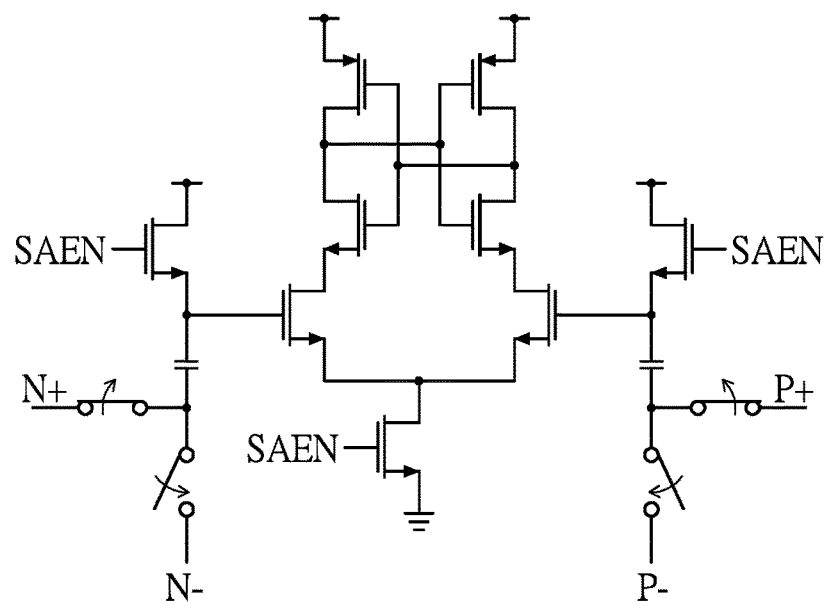

For exploiting the additional swing on the source line SL, the sense circuit 140A needs to be able to utilize the voltage between the bit line and the source line ($V_{BL}-V_{SL}$). For example, an additional pair of inputs in FIG. 6A can be directly added on the same sense circuit 140A. In FIG. 6B, the sense circuit 140A can incorporate both pull-down and pull-up paths. In FIG. 6C, another method is to incorporate inputs from both the pull-down path and the sensing nodes. In FIG. 6D, the voltage of the bit line $V_{BL}$ and the voltage of the source line $V_{SL}$ can be stored across a capacitor and used as a single input.

Furthermore, the proposed method can also include offset cancelling or margin enhancing amplifiers utilizing switching capacitors, but is not limited in the present disclosure.

Figure 7:
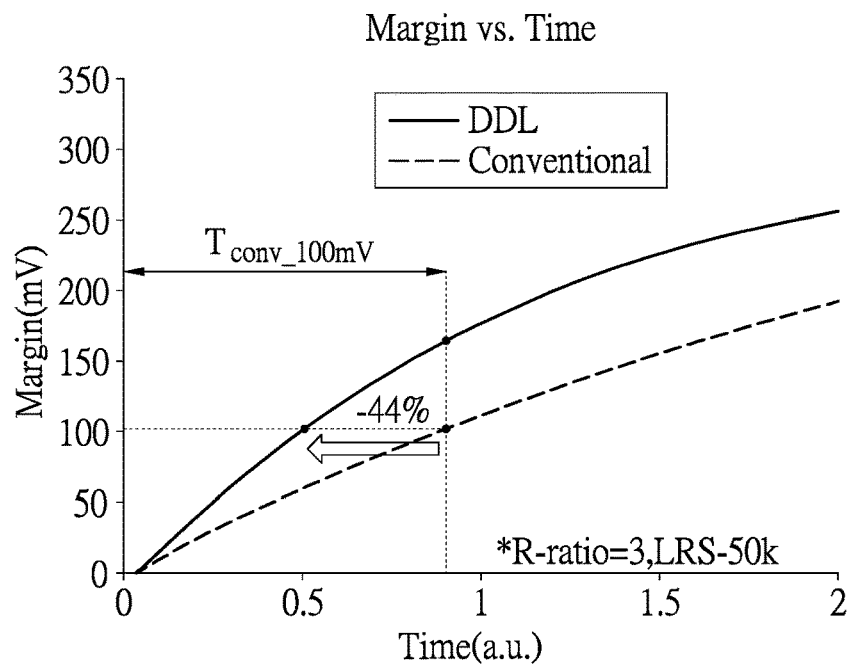
FIG. 7 is a simulated result of a sensing margin as a function of time of one embodiment of the present disclosure.
Figure 8:
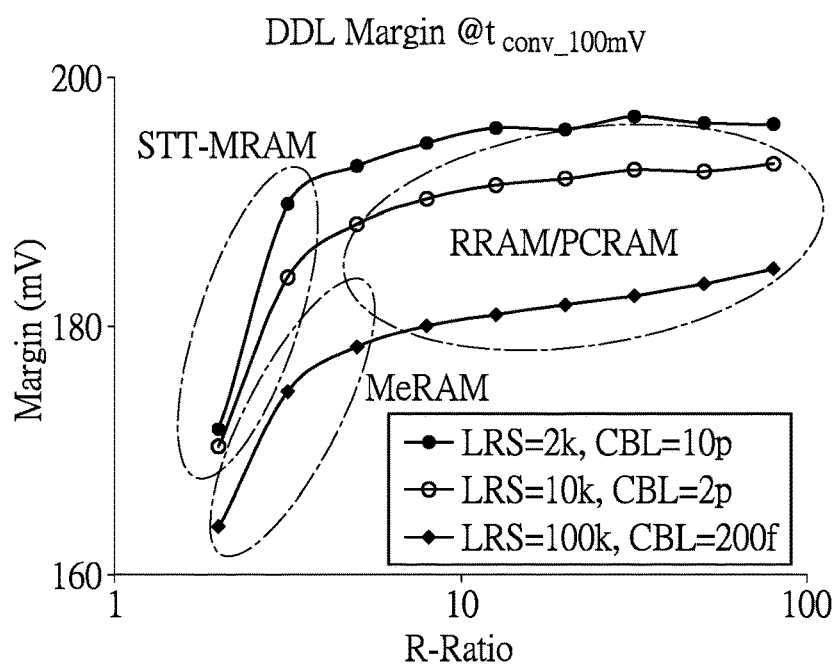
FIG. 8 is a simulated result of the sensing margin as a function of R-Ratio of one embodiment of the present disclosure.
Figure 9:
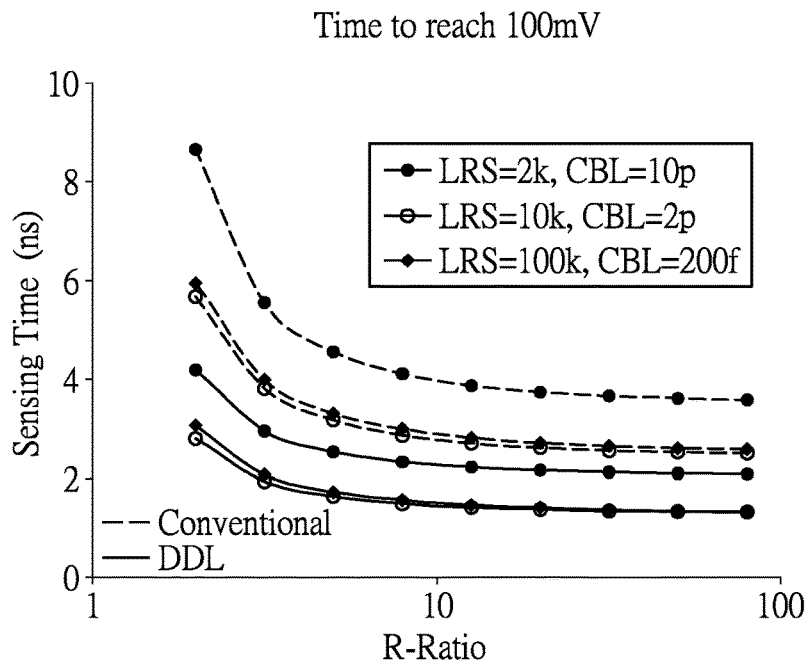
FIG. 9 is a simulated result of the sensing time of the dual-data line sensing circuit as a function of R-Ratio of one embodiment of the present disclosure.
Figure 10:
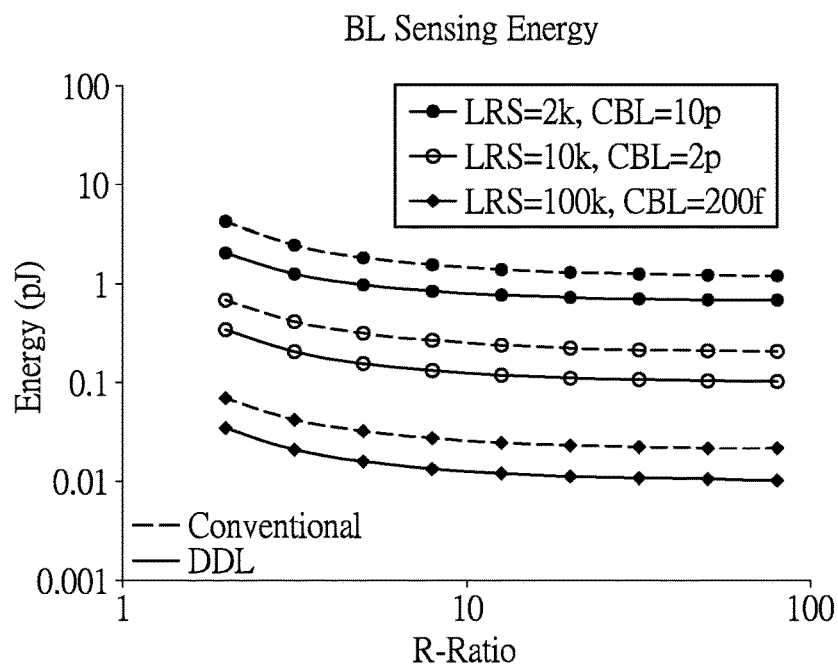
FIG. 10 is a simulated result of the sensing energy of the dual-data line sensing circuit as a function of R-Ratio of one embodiment of the present disclosure.
Figure 11:
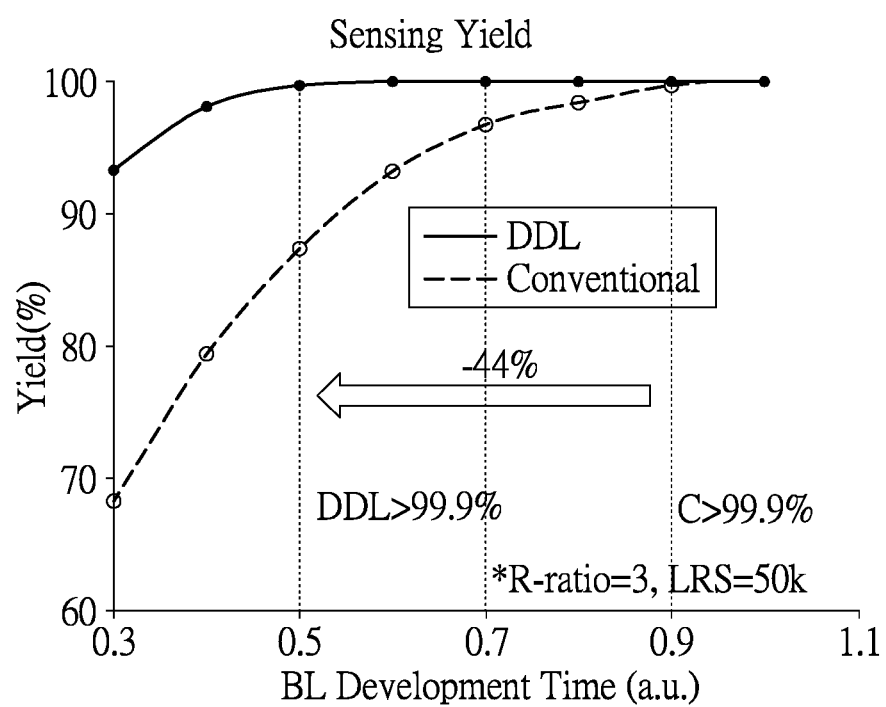
FIG. 11 is a simulated result of the sensing yield of the dual-data line sensing circuit as a function of BL development time of one embodiment of the present disclosure.

Referring to FIGS. 7-11, FIG. 7 is a simulated result of a sensing margin as a function of time of one embodiment of the present disclosure, FIG. 8 is a simulated result of the sensing margin as a function of R-Ratio of one embodiment of the present disclosure, FIG. 9 is a simulated result of the sensing time of the dual-data line sensing circuit as a function of R-Ratio of one embodiment of the present disclosure, FIG. 10 is a simulated result of the sensing energy of the dual-data line sensing circuit as a function of R-Ratio of one embodiment of the present disclosure, and FIG. 11 is a simulated result of the sensing yield of the dual-data line sensing circuit as a function of R-Ratio of one embodiment of the present disclosure.

Referring to FIG. 7, A voltage margin of $2V_M$=100 mV is used as a reference for comparison, and the time required for the conventional sensing method develops this margin is symbolled by $t_{CONV\_100mV}$. The sensing circuit of the present disclosure achieves 52% larger margin (i.e. 152 mV) at $t_{CONV\_100mV}$. For the same amount of margin, the sensing circuit in the present disclosure can reduce the BL development time by 44%.

Referring to FIG. 8, depending on parameters such as process, technology, and material, different memory macro have different resistance values (R-Value), as well as ratios (R-Ratio), between its high resistive state and low resistive state.

The sensing circuit in the present disclosure achieves an average margin improvement of 69%, 89%, and 91% across different R-ratios of 2, 10, and 100, respectively. For different LRS values of 2 k, 10 k, and 100 k, a margin improvement of 92%, 88%, and 78% can be observed.

Referring to FIG. 9, the sensing time is measured as the time in which the margin reaches 100 mV. The DDL achieves a ~50% reduction in sensing time for all cases.

Referring to FIG. 10, the energy reduction is ~50%, and does not vary significantly across different conditions.

Referring to FIG. 11, as the sensing time increases, the yields of both sensing methods increase. To achieve a specification of >99.9% yield, the conventional sensing method requires a sensing time of 0.9, while sensing circuit in the present disclosure can achieve the same performance under a BL developing time of 0.5.

According to the above, the sensing circuit of the present disclosure employs two floating input terminals and two reference terminals (total of four voltage terminals) to detect the high-resistive state resistance and the low-resistive state resistance of the memory cell for enhancing the reading speed and reducing the power consumption. Furthermore, the sensing circuit of the present disclosure also reduces the voltage stress across the memory cell to reduce the read disturb. We refer to the above embodiment as the dual-data line (DDL) scheme.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:
1. A memory macro, comprising:
a main control module;
an I/O driver;
a memory cell array comprising a plurality of memory cells, each memory cell comprising a transistor and a resistive memory device;
an X-decoder, electrically connected to the main control module for receiving at least one X-direction control signal;
a Y-multiplexer electrically connected to the main control module for receiving at least one Y-direction control signal; and
a Read/Write circuity comprising a plurality of sensing circuits, wherein the Read/Write circuity is electrically connected to the I/O driver, and electrically connected to the memory cell array through the Y-multiplexer;
wherein the sensing circuit is electrically connected to a memory cell, the sensing circuit comprising:
a first sensing terminal, electrically connected to a drain electrode of the transistor through the resistive memory device to a bit line, and not continuously connected to a precharge voltage;
a second sensing terminal, electrically connected to a source electrode of the transistor through a source line, and not continuously connected to a reference voltage;
a first grounding terminal, used as a reference of a voltage of the first sensing terminal; and
a second grounding terminal, used as a reference of a voltage of the second sensing terminal;
wherein when the sensing circuit is in an initial state, the first sensing terminal and the first grounding terminal are connected to a precharge voltage, and the second sensing terminal and the second grounding terminal are connected to the grounding voltage, during signal development, the first sensing terminal, the second sensing terminal, the first grounding terminal, and the second grounding terminal are floating;
wherein the sensing circuit outputs a sensing signal according to a voltage difference between the first sensing terminal and the first grounding terminal, with respect to the voltage difference between the second sensing terminal, and the second grounding terminal.

2. The memory macro of claim 1, wherein the voltage of the first sensing terminal is obtained by the following equation:

$$V_{BL\_DDL}(t) = V_{READ}\left(\frac{C_X}{C_{SL}} + \frac{C_X}{C_{BL}}\left(1 - \left(e^{\frac{-t}{R_{CELL}*C_X}}\right)\right)\right)$$

wherein the $V_{BL\_DDL}$ is the voltage of the first sensing terminal, $V_{READ}$ is a DC voltage source, $C_{BL}$ is a capacitance of the bit line, $C_{SL}$ is a capacitance of the source line, $C_X=(C_{BL}*C_{SL})/(C_{BL}+C_{SL})$, and $R_{CELL}$ is a resistance of the memory cell;
wherein the equation is a first-order approximation.

3. The memory macro of claim 2, wherein the voltage of the sensing terminal is obtained by the following equation:

$$V_{SL\_DDL}(t) = V_{READ} * \frac{C_X}{C_{SL}} * \left(1 - \left(e^{\frac{-t}{R_{CELL}*C_X}}\right)\right)$$

wherein the $V_{SL\_DDL}$ is the voltage of the second sensing terminal, $V_{READ}$ is a DC voltage source, $C_{BL}$ is a capacitance of the bit line, $C_{SL}$ is a capacitance of the source line, $C_X=(C_{BL}*C_{SL})/(C_{BL}+C_{SL})$, and $R_{CELL}$ is a resistance of the memory cell;
wherein the equation is a first-order approximation.

4. The memory macro of claim 1, wherein a gate electrode of the transistor of the memory cell is electrically connected to a word line.

5. The memory macro of claim 1, wherein the sensing circuit is an amplifier, computing the voltage difference between the first sensing terminal and the first grounding terminal, with respect to the voltage difference between the second sensing terminal and the second grounding terminal.

6. The memory macro of claim 1, wherein the first sensing terminal and the first grounding terminal are initially connected to the grounding voltage, and the second sensing terminal and the second grounding terminal are connected to the precharge voltage, during signal development, the first sensing terminal, the second sensing terminal, the first grounding terminal, and the second grounding terminal are floating.

* * * * *